United States Patent [19]

Kaplan

[11] 4,278,946
[45] Jul. 14, 1981

[54] CURRENT SCALING CIRCUITRY

[75] Inventor: Leonard A. Kaplan, Fords, N.J.

[73] Assignee: RCA Corporation, New York, N.Y.

[21] Appl. No.: 52,785

[22] Filed: Jun. 28, 1979

[51] Int. Cl.³ .............................. H03F 3/04; H03F 1/34
[52] U.S. Cl. ..................................... 330/288; 330/293
[58] Field of Search ................... 330/288, 293; 323/4; 307/296, 297

[56] References Cited

U.S. PATENT DOCUMENTS

| | | | |
|---|---|---|---|
| 3,754,181 | 8/1973 | Kreitz et al. | 323/1 |
| 3,956,645 | 5/1976 | Boer | 323/4 X |
| 4,019,121 | 4/1977 | Feindt | 323/4 |
| 4,176,308 | 11/1979 | Dobkin et al. | 323/4 |

Primary Examiner—James B. Mullins
Attorney, Agent, or Firm—J. M. O'Meara; P. M. Emanuel; Allan J. Jacobson

[57] ABSTRACT

Within current scaling circuitry having bipolar transistors of the same conductivity type disposed in principal master and slave paths, the negative feedback current gain around the principal master path transistor is regulated in direct proportion with the level of a current source that is independent from both of the principal master and slave paths, to substantially achieve tracking between the level of the current source and the levels of current flow through the principal master and slave paths.

5 Claims, 1 Drawing Figure

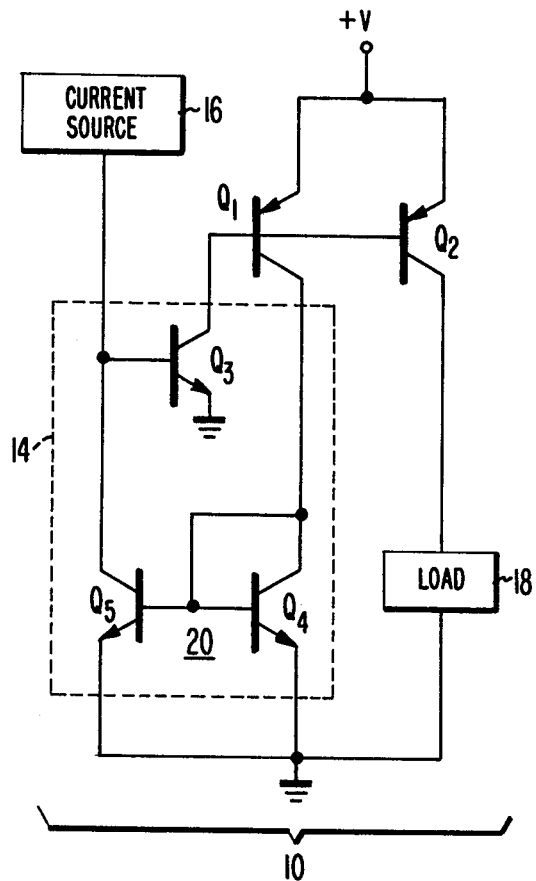

CURRENT SCALING CIRCUITRY

The present invention relates to circuitry of the type which includes bipolar transistors arranged in principal master and slave paths to achieve scaled current flow in the principal slave path relative to current flow in the principal master path.

The well-known current mirror amplifier which exhibits inverting current gain, is an example of such circuitry. Ideally, the level of current flowing through each principal slave path in a current mirror amplifier is proportional to the level of current flowing through the principal master path therein. However, when bipolar transistors are utilized in the principal master and slave paths of a current mirror amplifier, current flow through any principal slave path thereof does not precisely track in proportion to the principal master path current. This tracking error is mainly due to the base drive current of both the principal master and slave path transistors being diverted from the principal master path and it is most pronounced in simple current mirror amplifiers wherein a direct negative feedback connection is provided between the collector and base of the principal master path transistor. The tracking accuracy becomes worse in current mirror amplifiers as the current gain characteristic (beta) is lower for the principal master and slave path transistors or as the total principal slave path current is increased relative to the principal master path current. The dependency of the tracking accuracy on beta for simple current mirror amplifiers has been greatly reduced by modifying the direct negative feedback about the principal master path transistor by including a transistor of complementary conductivity type to the principal master and slave path transistors for producing current gain in that negative feedback loop. When transistors of complementary conductivity types are incorporated in integrated circuitry, however, those of one conductivity type are usually vertical structure transistors, while those of the other conductivity type are usually lateral structure transistors. Therefore, an undesirable tendency to oscillate is created in a current mirror amplifier that has been modified to produce current gain in its negative feedback loop because of the cumulative phase shifts which then exist around that feedback loop.

The current scaling circuitry of the invention substantially overcomes the above-mentioned tracking accuracy problems by regulating the negative feedback current gain about the principal master path transistor in proportion with the level of a current source that is removed from or independent of both the principal master and slave paths. In one preferred embodiment, the independent current source controls the negative feedback current gain through vertical structure bipolar transistors of complementary conductivity type to lateral structure transistors in the principal master and slave paths of the current scaling circuitry. The vertical structure transistors are disposed as a feedback gain regulating transistor having its conductivity controlled by the independent current source and a current mirror amplifier which includes secondary master and slave path transistors.

In the drawing, a schematic-block diagram of one embodiment of the invention is illustrated in the sole FIGURE, and a schematic diagram of the preferred embodiment is also incorporated therein.

In the sole FIGURE, current scaling circuitry 10 is shown of the type which includes bipolar transistors $Q_1$ and $Q_2$ of the same conductivity type in its principal master and slave paths respectively. To substantially improve the tracking accuracy of current flow through $Q_2$ relative to current flow through $Q_1$, a control means 14 is included for regulating the negative feedback current gain around $Q_1$ in direction proportion with the level of flow from a current source 16 that is independent of both the principal master and slave paths through the current scaling circuitry 10.

As discussed previously regarding prior art current scaling circuitry having bipolar transistors in its principal master and slave paths, the tracking accuracy between current levels in the principal master and slave paths is not precise. When a simple current mirror amplifier having a direct negative feedback connection between the collector and base of its principal master path transistor is utilized as current scaling circuitry, the equation for the current scaling is $$I_{sp} = \frac{K\beta}{\beta + 1 + K} I_{mp}$$

where $I_{sp}$ is the principal slave path current; $I_{mp}$ is the principal master path current; K is the desired current scaling factor between $I_{sp}$ and $I_{mp}$; and $\beta$ is the beta of the principal master and slave path transistors. As can be seen from this equation, the tracking accuracy worsens as $\beta$ decreases. When current gain is included for the negative feedback between the collector and base of the principal master path transistor in a simple current mirror amplifier, the equation for the current scaling becomes $$I_{sp} = \frac{K(\beta^2 + \beta)}{\beta^2 + \beta + 1 + K} I_{mp}.$$

As can be seen from this equation, the tracking accuracy also worsens as $\beta$ decreases, but to a lesser degree than for a simple current mirror amplifier. In the current scaling circuitry 10 of the invention, the negative feedback current gain about the principal master path transistor is regulated in proportion with the level of the current source 16 which is independent of both the principal master and slave paths. Therefore, the current source 16 encounters no loading factors from either of those paths and the tracking accuracy in the current scaling circuitry 10 is improved substantially.

Although many embodiments of the control means 14 are possible, the schematic diagram of one preferred embodiment thereof is illustrated in the sole FIGURE where a load 18 is connected to receive output current from $Q_2$. The negative feedback around the $Q_1$ is made through a gain regulating transistor $Q_3$ and through a current mirror amplifier 20 having transistors $Q_4$ and $Q_5$ in secondary master and slave paths respectively. $Q_3$, $Q_4$ and $Q_5$ are bipolar transistors of complementary conductivity type to $Q_1$ and $Q_2$. The main conduction path through $Q_4$ and the commonly connected base electrodes of $Q_4$ and $Q_5$ are connected to conduct the current which flows through $Q_1$. The main conduction path through $Q_5$ and the base electrode of $Q_3$ are connected to conduct the current supplied from the source 16, while the main conduction path through $Q_3$ is connected to apply drive current at the commonly connected base electrodes of $Q_1$ and $Q_2$.

Because the negative feedback in the current scaling circuitry 10 is applied at the commonly connected base electrodes of $Q_1$ and $Q_2$, the currents drawn through the principal master and slave paths thereof are directly proportional to the current level of that feedback. This feedback current level is substantially regulated in direct proportion with the current level of the source 16 which supplies current to both the base of $Q_3$ and the main conduction path of $Q_5$. As current flow increases through the main conduction path of $Q_1$, current flow also increases through $Q_4$ and $Q_5$ to decrease the level of feedback current to the base of $Q_1$, as a result of the base drive current to $Q_3$ being decreased by an amount equal to the increased current flow through $Q_5$. Since the level of current demanded by the main conduction path of $Q_5$ must be substantially proportional to the current supplied from the source 16 owing to the feedback, and since that demanded current is also held in proportion to the current supplied to the main conduction path of $Q_4$ owing to the current mirror amplifier connection of $Q_4$ and $Q_5$, current flow through both the principal master and slave paths of the current scaling circuitry 10 are maintained at levels substantially in proportion to the current level of the source 16. That is, the current level supplied by source 16 may be increased or decreased respectively, to increase or decrease the current flow in those paths. Because integrated circuitry transistors of complementary conductivity type have widely disparate cutoff frequencies, a dominant pole is realized with this embodiment of the control means 14 to thereby render the current scaling circuitry 10 of the invention inherently stable. Furthermore, current form the source 16 encounters only a single base-emitter junction drop in this embodiment to result in relatively minor power dissipation. The equation for the current scaling achieved with this embodiment of the invention is $$I_{Psp} = \frac{K}{\frac{\beta_S}{M\beta_S + M + 1} + \frac{K+1}{\beta_S\beta_P}} I_{Pmp}$$

where $I_{Psp}$ is the principal slave path current; $I_{Pmp}$ is the principal master path current; K is the desired current scaling factor between the currents that flow through $Q_1$ and $Q_2$; M is the desired scaling factor between the currents that flow through $Q_4$ and $Q_5$; $\beta_S$ is the beta of the secondary master and slave path transistors; and $\beta_P$ is the beta of the principal master and slave path transistors. As can be seen from this equation, the tracking accuracy for the current scaling circuitry 10 of the invention is much improved over either the simple current mirror amplifier or its modified form having feedback current gain, which were discussed previously.

As known in the art, where the current scaling circuitry 10 is integrated on a monolithic chip, current flow through the principal or secondary master and slave paths is related by the collector periphery ratio of $Q_1$ and $Q_2$ or $Q_4$ and $Q_5$ when those transistors have lateral structures but is related by the emitter area ratio of those transistors when they have vertical structures. Therefore, the direct proportionality between the current level of the source 16 and the current level applied to the load 18 through the principal slave path may be scaled either upwards or downwards by fixing one of these ratios between $Q_1$ and $Q_2$, or by fixing the other of these ratios between $Q_4$ and $Q_5$. Furthermore, $Q_1$ and $Q_2$ may either be PNP transistors or NPN transistors so long as $Q_3$, $Q_4$, and $Q_5$ in the control means 14 are of complementary conductivity type.

PNP transistors are utilized for $Q_1$ and $Q_2$ in the specific embodiment that is shown in the sole FIGURE. A supply voltage $+V$ is applied to the emitter electrodes of $Q_1$ and $Q_2$, and the base electrodes of these transistors are commonly connected to the collector electrode of $Q_3$ which has its emitter electrodes connected to a reference voltage, such as ground. The collector electrode of $Q_2$ is connected through the load 18 to the reference voltage while the collector electrode of $Q_1$ is connected to the collector electrode of $Q_4$ and also to the commonly connected base electrodes of $Q_4$ and $Q_5$. Current from the source 16 is applied to the base electrode of $Q_3$ and to the collector electrode of $Q_5$, while the reference voltage is also applied to the emitter electrodes of both $Q_4$ and $Q_5$.

In this specific embodiment of the invention, the current levels flowing through $Q_4$ and $Q_5$ in the secondary master and slave paths respectively, are controlled in direct proportion to the principal master path current level flowing through $Q_1$. As the current level flowing through $Q_5$ either increases or decreases, however, the base current level being applied to $Q_3$ from the source 16 is decreased or increased respectively. Therefore, a negative feedback is applied around $Q_1$ through $Q_3$ to maintain the current levels through $Q_1$ and $Q_2$ substantially in direct proportion to the current level of the source 16.

Those skilled in the art will realize without further explanation that the current scaling circuitry of this invention is disclosed herein by describing only a few embodiments thereof and numerous changes in the details of construction and the combination or arrangement of parts could be made in these described embodiments without departing from the true scope and spirit of the invention. Therefore, the embodiments shown in the drawing should be construed as illustrative rather than limiting.

What I claim is:

1. In an amplifier having input and output terminals, said amplifier comprising first and second transistors of like conductivity type having respective emitter, base and collector electrodes, wherein said second transistor is connected to conduct an output current at said output terminal, said amplifier further comprising improved feedback means connected between the collector and base electrodes of said first transistor for conditioning said first transistor to conduct a current substantially proportional to a current applied at said input terminal, said feedback means comprising:

a current mirror amplifier having master and slave paths, said master path being connected to conduct current at the collector electrode of said first transistor, said slave path being connected to substantially conduct a current applied at said input terminal, the current in said slave path being substantially proportional to the current in said master path; and buffer means responsive to the difference between said input current and said current in said slave path of said current mirror amplifier for providing respective base currents of said first and second transistors.

2. A circuit according to claim 1 wherein said buffer means comprises:

a third transistor of opposite conductivity type as said first and second transistors, having respective emitter, base and collector electrodes, the base electrode thereof being connected to said input terminal, the collector electrode thereof being connected to the respective base electrodes of said first and second transistors, and the emitter electrode thereof being connected for receiving a source of reference potential.

3. A circuit according to claim 2 wherein said current mirror amplifier comprises:

fourth and fifth transistors of the same conductivity type as said third transistor, each having respective emitter, base and collector electrodes;

means for connecting the collector electrode of said fifth transistor to said input terminal;

means for connecting the collector electrode of said fourth transistor to the collector electrode of said first transistor;

means for connecting the base electrode of said fourth transistor to the base electrode of said fifth transistor;

means for connecting the respective emitter electrode of said fourth and fifth transistors to a source of reference potential; and second feedback means responsive to the signal at the collector electrode of said fourth transistor, for conditioning said fourth transistor to conduct the current applied at its collector electrode.

4. A circuit according to claim 3 wherein said second feedback means comprises a direct connection without substantial intervening impedance between the collector electrode and base electrode of said fourth transistor.

5. A circuit according to claim 4 wherein said first and second transistors are PNP type transistors, and said third, fourth and fifth transistors are NPN type transistors.

* * * * *